United States Patent [19]

Larsen et al.

[11] Patent Number: 4,764,773

[45] Date of Patent: Aug. 16, 1988

[54] MOBILE ANTENNA AND THROUGH-THE-GLASS IMPEDANCE MATCHED FEED SYSTEM

[75] Inventors: L. James Larsen; David M. Phemister, both of Vancouver, Wash.

[73] Assignee: Larsen Electronics, Inc., Vancouver, Wash.

[21] Appl. No.: 760,405

[22] Filed: Jul. 30, 1985

[51] Int. Cl.[4] ......................... H01Q 1/32; H03H 7/38

[52] U.S. Cl. .................................... 343/713; 343/715; 343/745; 343/859; 343/861; 333/32; 333/25

[58] Field of Search ............................... 343/711-715, 343/745, 749, 750, 850, 859, 860, 865, 792, 861; 333/32, 25; 455/121, 129

[56] References Cited

U.S. PATENT DOCUMENTS

| | | | |
|---|---|---|---|
| 1,715,952 | 6/1929 | Rostron | 343/850 |
| 2,107,025 | 2/1938 | Buschbeck et al. | 333/32 X |
| 2,206,820 | 7/1940 | Mydlil | 343/888 X |
| 2,267,951 | 12/1941 | Roosenstein | 343/860 X |
| 2,578,154 | 12/1951 | Shanklin | 343/752 |
| 2,829,367 | 4/1958 | Rychlik | 343/850 |
| 3,474,453 | 10/1969 | Ireland | 343/745 |
| 4,028,704 | 6/1977 | Blass | 343/715 |
| 4,089,817 | 5/1978 | Kirkendall | 343/713 |
| 4,238,799 | 12/1980 | Parfitt | 343/715 |
| 4,395,713 | 7/1983 | Nelson et al. | 343/713 |
| 4,630,061 | 12/1986 | Hately | 343/749 |
| 4,658,259 | 4/1987 | Blaese | 343/715 |

FOREIGN PATENT DOCUMENTS

| | | |
|---|---|---|
| 2543973 | 8/1976 | Fed. Rep. of Germany . |
| 56-20304 | 2/1981 | Japan . |
| 438506 | 11/1935 | United Kingdom . |

OTHER PUBLICATIONS

Johnson, R. W.; "Multi-Band L Matching Network, Wide-Range Matching by Capacitance Variation"; *QST;* vol. 39, No. 12, Dec. 1955; pp. 45-47.

Mobile Mark, Inc. instruction manual for Model OW-900 antenna.

*Primary Examiner*—Eugene R. LaRoche
*Assistant Examiner*—Benny Lee
*Attorney, Agent, or Firm*—Klarquist, Sparkman, Campbell, Leigh & Whinston

[57] ABSTRACT

The present invention is a moisture-insensitive system adapted to couple radio frequency energy at a low impedance from a matched two conductor transmission line, through a vehicle windshield and to an antenna in a manner which minimizes stray radio frequency radiation within the passenger compartment of the vehicle. The system includes two pair of conducting plates, one pair mounted on each side of the windshield, each pair opposite the other pair. A coaxial feed line is coupled to the inside pair of plates and a matching circuit is connected across the outside pair of plates. A full-size, unloaded antenna element is connected to the output of the matching circuit. A decoupling device, such as a decoupling sleeve or a RF choke, can be used to minimize RF current flow on the shield conductor of the coaxial feed line. The coaxial cable is coupled directly through the windshield, without an intervening matching network, so that RF energy at a low impedance is coupled to the outside pair of plates. This low impedance minimizes parasitic coupling of the feed system to moisture on the windshield, windshield wipers and other foreign bodies. The elements of the invention cooperate to minimize the level of stray radiation within the passenger compartment of the vehicle and provide, in the illustrated embodiment, a 2.0:1 VSWR bandwidth that extends from 830 to 880 megahertz.

25 Claims, 2 Drawing Sheets

MOBILE ANTENNA AND THROUGH-THE-GLASS IMPEDANCE MATCHED FEED SYSTEM

TECHNICAL FIELD

This invention relates generally to feed systems for mobile antennas, and more particularly to through-the-glass feed systems for mobile antennas.

BACKGROUND OF THE INVENTION

It has long been known that radio frequency (RF) signals may be coupled through an insulating material, such as glass, by mounting a conducting plate on each side of the insulating material, thereby forming a coupling capacitor. U.S. Pat. No. 1,715,952 to Rostron is one early reference teaching this general principle.

U.S. Pat. No. 2,829,367 to Rychlik applied this general principle to the problem of coupling a balanced line through an insulating window. Each conductor of the balanced transmission line is capacitively coupled by using a pair of conducting plates mounted on opposite sides of the glass. The patent teaches that such capacitive elements can be inserted in an electrical circuit with minimum loss if the point of insertion of the capacitive elements has a high impedance. The patent further discloses methods by which a low transmission line impedance can be converted into an effectively high impedance, for coupling through glass, and again restored to a low impedance by use of reciprocal transformers. The Rychlik system is unsuited for transmit operation and its performance is seriously degraded when the window is wet.

German Pat. No. 2,543,973 to Laurent describes a vehicle antenna, capacitively fed through a windshield, in which the antenna element is directly connected to, and supported by, the outside conducting plate.

Mobile Mark, Inc. offers an "OW-900" 800 megahertz windshield mounted antenna in which the center conductor of a coaxial feed line is connected to an inside coupling plate. A pair of parallel, spaced-apart quarter-wavelength vertical radiators are connected to the outside coupling plate. The shield conductor of the coaxial cable is connected to two "field cancelling" conductor strips which extend radially outward from the feed point on the inside surface of the windshield. The "field cancelling" conductors have no counterpart on the outside surface of the windshield.

Several problems are inherent in the design of the OW-900 antenna. One is that the antenna's radiation pattern is not omnidirectional, thereby causing the antenna to radiate poorly in some directions. Another problem is the radiation of substantially levels of RF energy into the passenger compartment of the vehicle during transmit operation. This is particularly important in the 800 megahertz and other VHF and UHF bands, where such radiation has been shown to have deleterious effects on human tissue. Lastly, the antenna elements used in the OW-900 system have virtually no vertical plane gain, resulting in a weaker transmitted and received signal than competing antenna systems.

Recently, it has been taught to provide an impedance matching circuit integrally with a windshield mounted, through-the-glass fed antenna system so as to lower the antenna's standing wave ratio. A low standing wave ratio is important for proper operation of radio transmitter units.

U.S. Pat. No. 4,089,817 to Kirkendall illustrates one such system in which a matching network is interposed between the center conductor of a coaxial feed line and an inside coupling plate. The shield conductor of the coaxial feed line is grounded to the vehicle body. The inside coupling plate comprises two irregularly shaped, rotably connected plates, thereby permitting the effective size of the inside plate, and consequently the value of the coupling capacitor, to be varied. This feature allows the matching circuit to be resonated by rotating one inside plate relative to the other. The Kirkendall antenna is mounted directly to, and is supported by, the outside coupling plate.

The Kirkendall system suffers from a number of drawbacks. One is the comparatively high level of stray radio frequency radiation inside the passenger compartment of the vehicle. Another drawback is the necessity to ground the shield conductor of the coaxial cable to the vehicle chassis. This connection must be made as close to the antenna as possible for optimum operation, thereby limiting the locations on the windishield at which the antenna can be mounted. Lastly, the Kirkendall coupling plates capacitively load the antenna, thereby rendering it less efficient than an unloaded antenna.

Another through-the-glass mobile antenna feed system with integral matching circuitry is shown in U.S. Pat. No. 4,238,799 to Parfitt. Parfitt discloses another system in which a matching network is interposed between the end of a coaxial feed line and an inside coupling plate. The ground conductor of the coaxial feed line is again connected to the vehicle chassis. The antenna is again mounted directly to, and is supported by, the outside conducting plate.

The Parfitt system, although believed to be illustrative of the state of the art in this technology, still present several important problems:

(a) A comparatively high level of stray radio frequency energy is again radiated into the passenger compartment of the vehicle during transmit operation.

(b) Parfitt's capacitive coupling plates again introduce a capacitive loading effects which renders the antenna less efficient than a comparable, unloaded antenna.

(c) The Parfitt system generally requires a grounding strap be connected from the inside matching circuit to the vehicle chassis for optimum operation. This, again, constrains placement of the antenna on the windshield, since the length of the grounding strap must be kept as short as possible.

(d) The Parfitt system is subject to marked variations in impedance and radiation characteristics when the windshield becomes wet, or when a foreign body, such as a windshield wiper, is moved in proximity to the base of the antenna.

Accordingly, a need remains from a through-the-glass antenna feed system that overcomes these drawbacks of the prior art.

SUMMARY OF THE INVENTION

It is an object of the present invention to reduce the stray radiation in the passenger compartment of a vehicle employing a through-the-glass fed antenna system.

It is yet a further object of the present invention to provide a through-the-glass fed antenna system that has a substantially omnidirectional radiation pattern.

It is a further object of the present invention to enable a through-the-glass antenna feed system to be used with an unloaded, self-resonant antenna.

It is yet a further object of the present invention to provide a through-the-glass feed system that an be operated optimally without being grounded to the vehicle chassis.

It is yet a further object of the present invention to provide a through-the-glass antenna feed system which is insensitive to the presence of moisture on the glass and foreign bodies near the matching network.

The present invention is a moisture-insensitive system adapted to couple radio frequency energy at a low impedance from a matched two conductor transmission line, through a vehicle windshield and to an antenna in a manner which minimizes stray radio frequency radiation within the passenger compartment of the vehicle.

A preferred embodiment of the through-the-glass antenna feed system of the present invention includes two pair of plates, one pair mounted on each side of a windshield, each pair opposite the other pair. A coaxial feed line is coupled directly to the inside pair of plates. A matching circuit is connected across the outside pair of plates. An unloaded antenna element is connected to the output of the matching circuit. A decoupling device, such as a decoupling stub, sleeve or RF choke, can be used to minimize RF current flow on the shield conductor of the coaxial feed line. By coupling the coaxial cable directly to the inner plates without an intervening matching network, RF energy is coupled through the windshield to the outside pair of plates at a low impedance. This low impedance helps render the system insensitive to the effects of moisture on the windshield. The matching network does not provide any antenna loading, thereby enabling the use of a full-size, self-resonant antenna with the system. The positioning of the matching circuit outside the vehicle, the shielding of the transmission line up to the glass, and the coupling of a two conductor transmission line through the glass all cooperate to minimize the level of stray radiation within the passenger compartment of the vehicle.

The foregoing and additional objects, features and advantages of the present invention will be more readily apparent from the following detailed description of a preferred embodiment thereof, which proceeds with reference to the accompanying drawings.

DETAILED DESCRIPTION

Preface

The through-the-glass feed system of the present invention is, for convenience, described with reference to a windshield mounted antenna designed for operation in the 800–880 megahertz frequency band. This frequency band is of particular interest due to the recent popularity of 800 megahertz cellular telephone systems. It should be understood, however, that the present feed system can be used at any frequency band, such as the 27 megahertz CB band or the 1.2 gigahertz amateur band, with equally advantageous results.

Similarly, the feed system of the present invention is not limited to use in connection with vehicle windshields. It may be used advantageously in any application in which radio frequency energy needs to be coupled to an antenna through an insulator. Such other applications include coupling radio frequency energy to an antenna through the fiberglass bodies of certain cars, boats, or aircraft, or through ceramic materials used in space vehicles.

Lastly, although the following description occasionally makes reference to transmitting, or coupling energy *to* an antenna, it should be recognized that under the principles of reciprocity these references are generally equally applicable to receiving, or coupling energy *from* an antenna.

Through-The-Glass Coupling

Figure 1:
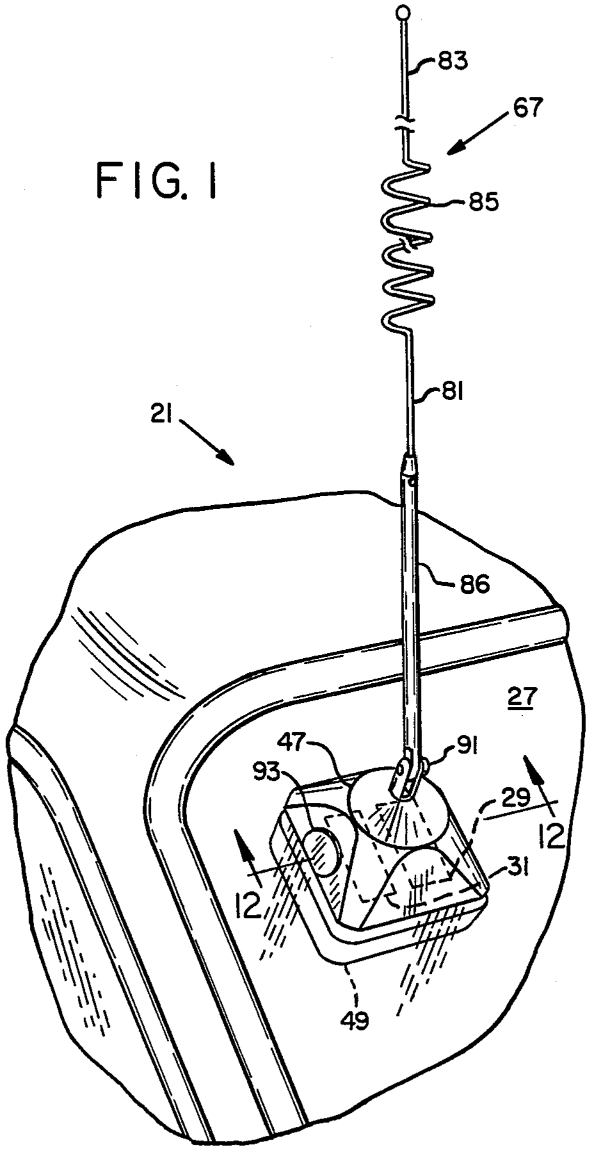
FIG. 1 is a perspective view of the feed system of the present invention mounted on the windshield of an automobile.
Figure 2:
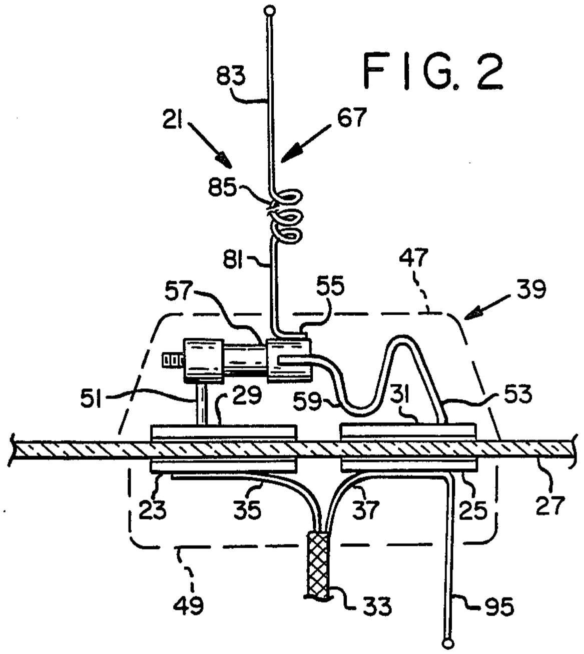
FIG. 2 is a side view of the feed system of FIG. 1 using a quarter-wave stub decoupling element.

The preferred embodiment of the through-the-glass feed system 21 shown in FIGS. 1 and 2 includes first and second inside conducting plates 23, 25 adjacent and affixed to an inside surface area of a windshield 27, and first and second outside conducting plates 29, 31 adjacent and affixed to an outside surface area of the windshield. First and second outside plates 29 and 31 are preferably positioned opposite the corresponding first and second inside plates 23 and 25, respectively. In alternative embodiments, however, the ouside plates need not be directly opposite the corresponding inside plates. Instead, the outside windshield surface area to which the outside plates are mounted need only be substantially opposite the inside windshield surface area to which the inside plates are mounted.

Plates 23, 25, 29 and 31 serve to couple radio frequency energy through windshield 27. A two conductor transmission line, such as 50 ohm unbalanced coaxial cable 33, having a first, or center conductor 35 and a second, or shield conductor 37, terminates adjacent the inside conducting plates 23 and 25 and couples RF energy from a transmitter unit (not shown) directly to these plates. First conductor 35 is coupled to first inside plate 23, and second conductor 37 is coupled to second inside plate 25.

Figure 3:
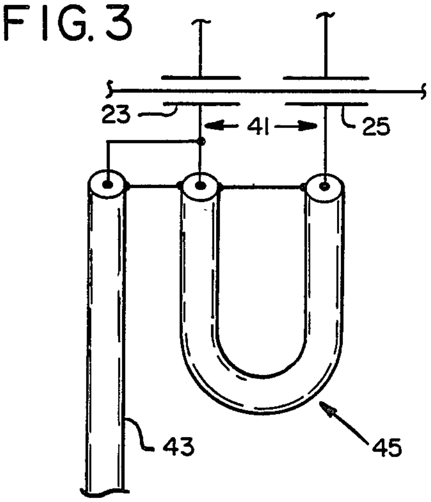
FIG. 3 is a partial schematic view of an alternative feed system in accordance with the present invention using a coaxial balun to couple radio frequency energy to the system.

In an alternative embodiment, a balanced transmission line 41 may be used to apply RF energy to inside conducting plates 23 and 25, as shown in FIG. 3. A coaxial line 43 may be converted into a balanced line 41 by a variety of techniques, such as by the illustrated coaxial balun 45 or by a toroidal balun (not shown). Such techniques sometimes involve an impedance transformatio between the unbalanced and balanced and unbalanced transmission line impedances. For example, the illustrated coaxial balun transforms the coaxial impedance of 50 ohms into a balanced transmission line impedance of 200 ohms. This 200 ohm value, however, still benefits from the advantages associated with low impedance coupling, detailed herein.

Figure 4:
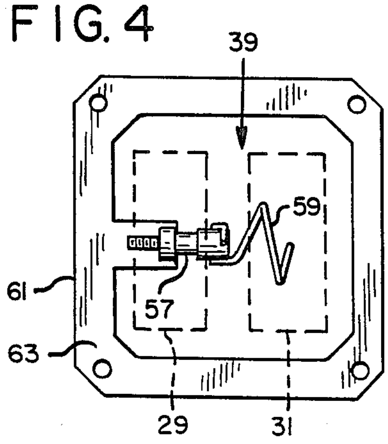
FIG. 4 is a top plan view of a double-sided printed circuit board on which the matching circuit of FIG. 2 is mounted.

The dimensions of feed system plates 23, 25, 29 and 31 illustrated in FIGS. 1, 2 and 4 are 0.5 by 1.125 inches. Each pair of plates 23, 29 and 25, 31 forms a coupling capacitance of approximately four picofarads. This value, however, is not critical. Other values of coupling capacitance may be accommodated by designing, or adjusting, a matching network 39 appropriately. The dimensions of plates 23, 25, 29 and 31 may also be scaled and sized for operation at different frequencies, as will be recognized by those skilled in the art. Furthermore, the shape of these plates is not limited to the rectangular shapes illustrated in the figures. Other geometries can work equally well. If these plates are made too large, however, a standing wave will develop in the plates which may interfere with proper wide-band operation of the antenna. The distance between the plates is approximately 0.3 inch. A wider spacing may be used, but this increases the size of the feed system, thereby increasing its wind resistance.

Inside plates 23, 25 can be covered by a small plastic enclosure 49. Outside plates 29, 31 can be covered by a plastic or metal housing 47, as described below.

Matching Networks

By virtue of the direct connection of transmission line 33 to inside plates 23 and 25, and the relative proximity of inside plates 23 and 25 to outside plates 29 and 31, a low impedance is presented across inside plates 23 and 25 and across outside plates 29 and 31. Thus, the magnitude of the RF voltage across the outside plates is substantially equal to the magnitude of the RF voltage across center conductor 35 and shield conductor 37 of coaxial feed line 33. In the preferred embodiment of the present invention, an external matching network 39 is provided for transforming the antenna impedance, as coupled to inside plates 23, 25, to the characteristic impedance of transmission line 33, thereby forming a conjugate match.

Figure 5:
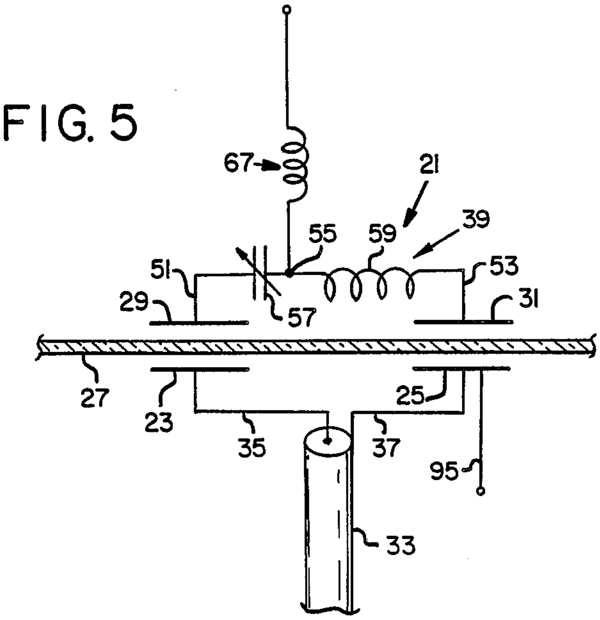
FIG. 5 is a schematic diagram of the feed system shown in FIG. 2.

In the preferred embodiment illustrated in FIGS. 2 and 4, and shown schematically in FIG. 5, external matching network 39 is connected across outside plates 29 and 31 and includes two inputs 51, 53 and an output 55. Each of inputs 51, 53 is connected to a different one of outside plates 29, 31. Output 55 is isolated from first outside plate 29 by a capacitive reactance presented by a capacitor 57. Output 55 is isolated from the second outside plate 31 by an inductive reactance presented by an inductor 59. For operation in the 800–880 megahertz frequency band, capacitor 57 is a variable piston-type capacitor having a range of 1 to 12 picofarads. Inductor 59 comprises one turn of No. 14 wire (0.0650 inch dia.) having a coil length of 0.375 inches and a diameter of 0.4 inches. Capacitor 57 and inductor 59 form a series circuit in which the first input 51 of matching network 39 is a first side of capacitor 57 electrically connected to plate 29, the second input of matching network 39 is a first end of inductor 59 connected to plate 31, and the output 55 of matching network 39 is the junction between capacitor 57 and inductor 59. Matching network 39 typically provides an inductive reactance component across outside plates 29, 31 which is canceled by the capacitive reactance of the through-the-glass coupling capacitors.

The illustrated matching network 39 may be constructed on a 2.06 inch square double-sided printed circuit board 61, as shown in FIG. 4. On the bottom side of the printed circuit board are etched the two outside conducting plates 29 and 31. On the top of the printed circuit board is a conducting strip 63, having a width of 0.125 inches, routed along the perimeter of the board. Conducting strip 63 is connected to first outside plate 29 and to capacitor 57.

The preferred embodiment of matching network 39, shown in FIGS. 2 and 5, may be viewed as a capacitively coupled "L" network of reactive components driving an unbalanced antenna from an unbalanced coaxial feed line. Plates 23 and 25 can be considered, in the unbalanced vernacular, inside "hot" and "common" plates, respectively. Plates 29 and 31 can similarly be considered outside "hot" and "common" plates, since they are capacitively coupled from inside plates 23 and 25, respectively. In this unbalanced view, matching circuit 39 can be considered an "L" network, with capacitor 57 being the series element and inductor 59 being the shunt element. The output of the "L" network, at the junction of capacitor 57 and inductor 59, drives the unbalanced antenna.

In an alternative matching network (not shown), capacitor 57 may be fixed and inductor 59 may be made variable. In another variation, capacitor 57 and inductor 59 may both be fixed. In such case, the system may nonetheless be tuned by varying the length of the antenna.

Figure 6:
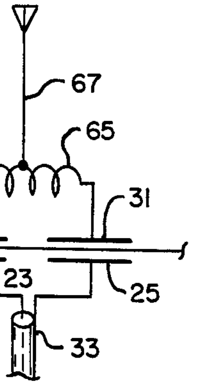
FIG. 6 is a schematic diagram of an autotransformer matching network suitable for use with an antenna having an impedance lower than the transmission line impedance, in accordance with one embodiment of the present invention.
Figure 7:
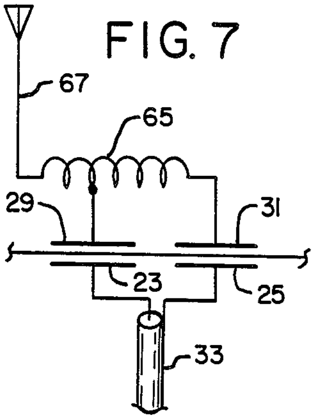
FIG. 7 is a schematic diagram of an autotransformer matching network suitable for use with an antenna having an impedance higher than the transmission line impedance, in accordance with another embodiment of the present invention.

In another alternative matching network, shown in FIGS. 6 and 7, an unbalanced transformer 65 can be used to match the antenna impedance, as coupled to inside plates 23, 25, to the characteristic impedance of a two conductor transmission line, such as coaxial feed line 33. The arrangement in FIG. 6 is used with antenna elements 67 having a feed point impedance less than the characteristic impedance of coaxial feed line 33, such as quarter-wavelength whips. The antenna is connected to transformer 65 at a point determined by the ratio of impedance across outside plates 29, 31 to the impedance of the antenna element, as is well known to those skilled in the art. The arrangement in FIG. 7 is used with antenna elements 67 having a feed point impedance greater than the characteristic impedance of coaxial feed line 33, such as half-wavelength whips. The design of transformer 65 in such case is again dictated by the ratio of the impedance across outside plates 29, 31 to the impedance of the antenna element.

The matching circuits shown in FIGS. 6 and 7 do not include a variable element for resonating the system. A good impedance match to the transmission line can nonetheless be obtained by selecting the length of the antenna element 67 and the inductance of transformer 65 so that a resistive impedance equal to the characteristic impedance of the transmission line is presented across inside plates 23 and 25. If, for example, the inductive reactance introduced by transformer 65 exceeds the capacitive reactance introduced by the through-the-glass coupling capacitors, then antenna element 67 must be slightly shorter than a quarter-wavelength (or longer than a half-wavelength) to provide the additional capacitive reactance needed to cancel the system's net inductive component. Similarly, if the inductive reactance introduced by transformer 65 is less than the capacitive reactance introduced by the coupling capacitors, then antenna 67 must be slightly longer than a quarter-wavelength (or shorter than a half-wavelength) to provide the additional inductive reactance needed to cancel the system's net capacitive component.

Figure 8:
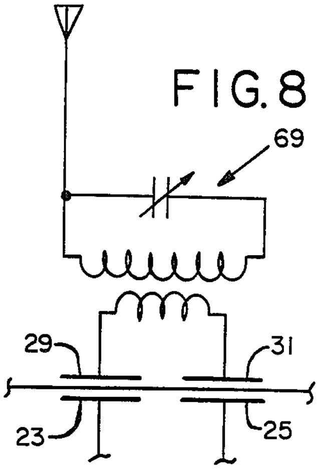
FIG. 8 is a schematic diagram of a feed system according to the present invention using an alternative matching circuit.
Figure 9:
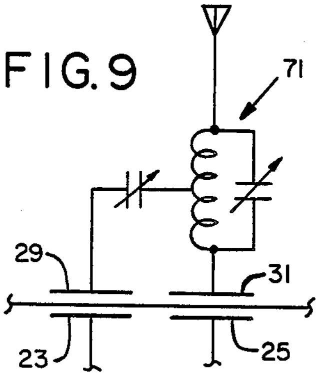
FIG. 9 is a schematic diagram of a feed system according to the present invention using a second alternative matching circuit.
Figure 10:
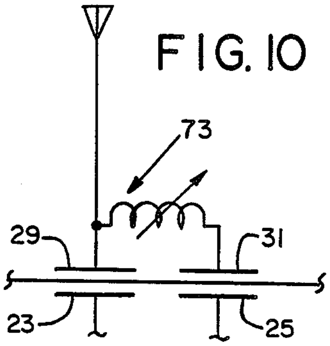
FIG. 10 is a schematic diagram of a feed system according to the present invention using a third alternative matching circuit.

A wide variety of other matching circuit topologies, not limited to the types described above, may also be used in the present invention, as is apparent to those skilled in the art. A small sampling of such alternative matching circuit topologies 69, 71, and 73 is shown in FIGS. 8 through 10.

Figure 11:
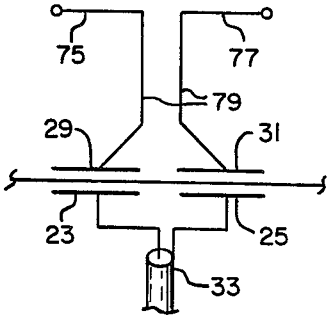
FIG. 11 is a schematic diagram of a feed system according to the present invention that does not use an external matching circuit.

Finally, in some applications, the external matching circuit may be eliminated entirely and two antenna elements 75, 77 may be coupled directly, or through a short transmission line 79, to the outside conducting plates 29, 31, as shown in FIG. 11. In the particular embodiment illustrated, antenna elements 75 and 77 are each slightly longer than a half-wavelength and are fed through a quarter-wavelength section of balanced 300 ohm transmission line 79. This 300 ohm transmission line serves to space the antenna elements from the windshield and additionally serves as an element of an external matching network. The dimensions and impedances of the illustrated system are selected to provide an antenna impedance across inside plates 23, 25 that matches the impedance of transmission line 33 without the need for an external matching circuit. In this particular example, the impedance across the feed point of the antenna elements 75 and 77 is somewhat greater than 300 ohms and has a capacitive reactance component. A quarter-wavelength section of transmission line 79 transforms this antenna impedance down to about 50 ohms plus an inductive reactance component. The antenna and transmission line are designed so that this inductive reactance component cancels the capacitive reactance component introduced by the coupling capacitors, thereby providing a purely resistive antenna impedance, equal to the transmission line impedance, across inside plates 23 and 25. A wide variety of other antenna element systems which obviate the need for an external lumped-constant matching circuit will be readily apparent to those skilled in the art.

From the above discussion, it can be appreciated that the capacitance introduced by coupling plates 23, 29 and 25, 31 always contributes a capacitive reactance components to the impedance coupled from outside plates 29, 31 to inside plates 23, 25. Feed systems according to the present invention use this capacitive reactance to compensate for the inductive impedance which is typically presented across outside plates 29, 31 by the antenna and/or the coupling elements. The capacitive component cancels this inductive component, yielding a resistive impedance across inside plates 23, 25 that matches the transmission line impedance. The coupling capacitors thus serve as elements of an intrinsic matching circuit that operates, in conjunction with an external matching circuit or in isolation, to provide a resistive impedance across inside plates 23, 25.

Antenna Element

The feed system of the present invention can be used with a variety of antenna elements. For maximum efficiency, the antenna element should be full size and self-resonant, i.e., it should have a purely resistive feed point impedance. Such an antenna configuration is efficient because the antenna is not resonated, or loaded, by a lump reactance component. A matching circuit, such as matching network 39 may be designed, or adjusted, to transform such a resistive antenna impedance into the characteristic impedance of the transmission line, so that a matched condition is obtained at inside plates 23 and 25.

The preferred antenna 67, illustrated in FIGS. 1 and 2, is an example of a suitable resonant antenna. It comprises two collinear half-wave elements 81 and 83 connected by a phasing coil 85. Phasing coil 85 causes half-wave elements 81 and 83 to radiate in phase. Since matching network 39 does not load the antenna, the length of bottom section 81 is measured directly from output 55 of matching network 39 to the bottom of phasing coil 85, and is exactly a half-wavelength in length. In the 800–880 megahertz frequency band, the length of bottom section 81 is 6.8 inches, the length of top section 83 is 6.8 inches and phasing coil 85 comprises 7.5 turns of No. 14 gauge wire with a diameter of 0.5 inches and a coil length of 3.25 inches. Other unbalanced resonant structures, such as quarter- or half-wavelength whips, as measured from output 55, can also be used with the feed system of the present invention. Similarly, a great variety of balanced resonant structures, such as dipoles, folded dipoles or loops, may be coupled, either directly or through an intervening matching network, to the outside plates.

In certain cases, it may be advantageous to use a balanced or unbalanced *non-resonant* antenna structure (not shown). Such an antenna structure may be desirable when there is insufficient room for a full-size antenna element, or when a desired vertical angle of radiation or antenna feed point impedance can be obtained by use of a non-resonant antenna. In such cases, matching network 39 may again be designed, or adjusted, to present a resistive impedance, as measured across inside plates 23, 25, that matches the transmission line's characteristic impedance.

Regardless of the antenna configuration, the bandwidth of the system is increased if a larger diameter antenna element is used. In the embodiment of the present invention shown in FIG. 1, antenna element 67 has a diameter of 0.05 inches along most of its length. The bottom portion 86 of the antenna, however, is formed from 0.25 inch tubing, thereby increasing the system's bandwidth. Alternatively, a conical element (not shown) can be used at the base of the antenna, tapering from 0.5 inches at the matching network output to 0.05 inches over a distance of approximately 1.5 inches, to provide a similar broadbanding effect.

Antenna Mounting Element

Figure 12:
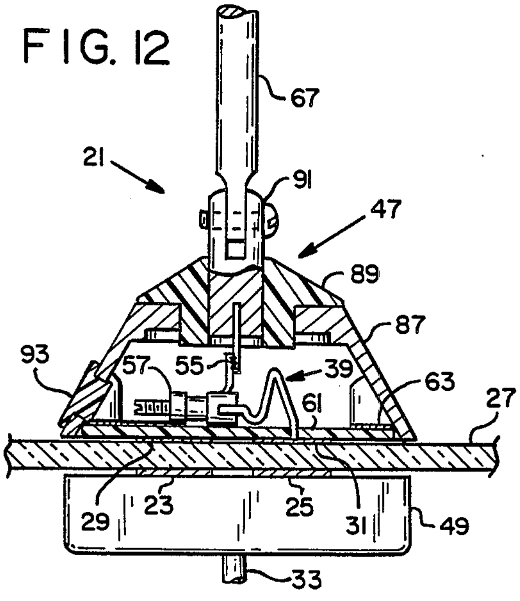
FIG. 12 is a cross-sectional view taken along lines 12—12 in FIG. 1.

The preferred embodiment of a through-the-glass feed system according to the present invention also includes an antenna coupling or mounting element 47, shown in FIGS. 1 and 12. Antenna mounting element 47 can serve several functions: isolating antenna 67 from at least one of the first and second outside plates 29 and 31; connecting antenna 67 to outside plates 29, 31 or to output 55 of matching network 39; mounting antenna 67 outside and spaced apart from windshield 27; and waterproofing matching network 39.

In the preferred embodiment, antenna mounting element 47 comprises a metal shell 87 sized to cover matching network 39 and outside plates 29, 31, and includes an insulating grommet 89 through which antenna 67 connects to matching circuit 39. An antenna mounting pivot point 91 can be mounted to grommet 89 to enable the antenna to be oriented vertically, regardless of the slope of vehicle windshield 27. Conducting shell 87 is electrically connected by a contact joint to conducting rim 63 on printed circuit board 61, which is turn is connected to first outside plate 29 through the circuit board. An access opening, plugged by watertight rubber plug 93, is provided in shell 87 to permit access to variable capacitor 57.

In this particular embodiment, metal shell 87 is believed to serve a broad banding function. It forms a second capacitive element, shunted across variable capacitor 57, from outside plate 29 to the antenna 67, and it also forms a tuned cavity element. The height of this cavity, from printed circuit board 61 up to grommet 89, is 0.75 inches. The inside of the cavity at printed circuit board 61 is 2.06 inches square. Shell 87 has a wall thickness of 0.1 inches. The 2.0:1 VSWR bandwidth of the feed system incorporating the illustrated metal shell extends from 830 to 880 megahertz. If the height of the cavity formed by metal shell 87 is increased to one inch. the bandwidth is reduced.

In other embodiments, antenna mounting element 47 may simply comprise a molded plastic member.

Mounting element 47 should be aerodynamically shaped to minimize its wind resistance. The minimum base area of mounting element 47 is primarily a function of the area of adhesive required to secure the system in place at high speeds, rather than the area required by outside plates 29 and 31. In the illustrated embodiment, the base is approximately 2.5 inches square, comparable to the corresponding elements in the prior art systems.

Plates 23, 25, 29 and 31 and mounting element 47 can be attached to the windshield by cement, double-sided adhesive tape or other means known to those skilled in the art.

Stray Radiation

Several factors contribute to the low level of stray radiation inside the vehicle's passenger compartment afforded by the present feed system. One is that potentially radiating components, such as the components of the matching network, have been moved outside the vehicle. Another is that the coaxial shield of the feed line extends all the way of the windshield, rather than terminating at an intervening matching circuit. Yet another factor is the use of two pairs of coupling plates, one coupled to the coaxial center conductor and one coupled to the coaxial shield, which largely constrain the associated electromagnetic fields to the small region between these pairs of plates, rather than allowing them to disperse in an unconstrained pattern around a single pair of plates, as occurs in the prior art. Other factors contributing to the low level of stray radiation are discussed in the Comparison with Prior Art Antenna Systems section, infra.

To further minimize stray radiation inside the vehicle's passenger compartment, feed system 21 may include a decoupling element for reducing the radio frequency current flow on shield conductor 37 of coaxial cable 33. This decoupling element can comprise a stub 95 having an electrical length of an odd number of quarter-wavelengths at the desired frequency of operation. Stub 95 is connected at its proximal end to second inside plate 25, as shown in FIGS. 2 and 5. Stub 95 is shown extending perpendicularly from windshield 27, but may alternatively be bent in any number of shapes to conform to the space requirements of a particular application. Similarly, stub 95 may be inductively loaded to reduce its physical length.

Figure 13:
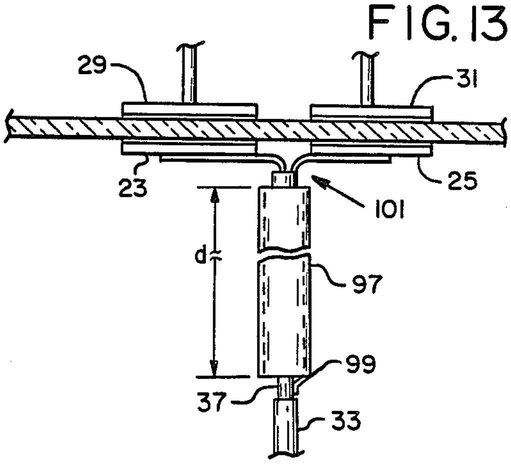
FIG. 13 is a partial side view of a feed system in accordance with the present invention using a sleeve decoupling element.

In another embodiment, the decoupling element can comprise a conductive sleeve member 97 surrounding a section of the coaxial feed line 33, as shown in FIG. 13. A first end 99 of sleeve member 97 is connected to shield conductor 37 of coaxial feed cable 33 at a distance spaced apart from the end 101 of coaxial cable 33. Sleeve 97 extends, insulated from shield conductor 37, for a distance d substantially equal to an odd number of electrical quarter-wavelengths in the sleeve, toward end 101 of the coaxial cable 33 adjacent first and second inside conducting plates 23 and 25. For maximum effectiveness, sleeve 97 should be positioned so as to terminate near end 101 of coaxial cable 33.

Decoupling stub 95 and sleeve 97 additionally serve the desirable function of helping maintain inside plate 25 at RF ground, thereby optimizing the performance of the antenna system.

Figure 14:
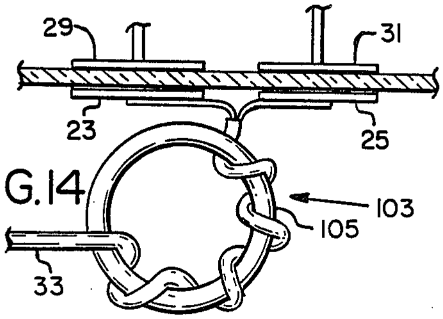
FIG. 14 is a partial side view of a feed system in accordance with the present invention using a RF choke decoupling element.

In yet another embodiment, the decoupling element can comprise a RF choke 103, as shown in FIG. 14. Such a choke may include a doughnut-shaped ferromagnetic core 105 through which coaxial feed cable 33 is looped.

Comparison with Prior Art Antenna Systems

The prior art Parfitt antenna system is commercially available under the ANTENNA SPECIALIST trademark. A physical examination of the matching network associated with the 800 megahertz version of this system reveals that the center conductor of the incoming coaxial line is virtually short-circuited to ground where it enters the matching network enclosure. The matching network enclosure is a small aluminum box on which a female coaxial connector is mounted. A 0.375 inch, 14 ga. length of copper wire connects the center conductor of this connector to a small copper plate riveted to the inside surface of the aluminum box, adjacent the connector. This wire forms the lower winding of a low impedance to high impedance autotransformer. The impedance transformation ratio is in excess of 500 to 1, thereby necessitating the tiny inductance connecting the center conductor of the connector to ground. Such a configuration, however, is inherently lossy, because the Q of the small inductance is very low (i.e., the resistance of the short piece of wire is appreciable in comparison to its inductive reactance).

The use of such a small inductance in the matching circuit also renders the return connection through the aluminum box, between the riveted copper plate and the connector, a non-negligible element of the inductor. Such use of the aluminum enclosure as a circuit element causes standing waves to develop on the surface of the enclosure, resulting in radiation inside the passenger compartment of the vehicle.

The Parfitt system further suffers from the presence of a high impedance (viz. 25,000 to 100,000 ohms) at the coupling capacitor. The windshield that serves as the insulating medium of the coupling capacitor is not a perfect insulator. The losses inherent in the use of any non-perfect insulator are magnified when such insulators are used in high impedance systems, and are even further magnified in the present instance due to the ultra-high frequencies involved.

In contrast, the feed system of the present invention does not include a lossy, low Q inductive element shunted directly across the incoming feed line. Nor does the present invention use, as a critical element of the matching network, the surface of the metal enclosure mounted inside the vehicle. Lastly, the losses associated with use of a non-perfect insulator in the coupling capacitors are minimized in the present invention by operating these capacitors in a low impedance circuit.

Field strength measurements at 800 megahertz of the prior art Parfitt antenna and the antenna shown in FIG. 2 indicate that stray radiation inside the passenger compartment with the present invention is more than 10 dB below that measured with the Parfitt system.

Far field measurements outside the vehicle also revealed a marked difference between the two systems. With the antennas mounted on the upper part of the front windshield of a vehicle, the field strength off the back of the vehicle was several decibels lower with the Parfitt system than with the present invention. This is attributable to the different current distributions along the two antennas. In the present invention, the maximum current point, from which most energy is radiated, is slightly above the roof line, at the middle of the lower half-wavelength section 81 of antenna element 67. In the Parfitt system, however, the maximum current point is very near the outside coupling plate, well below the roof line, due to the heavy capacitive loading of the antenna introduced by the through-the-glass coupling capacitor. By lowering this point of maximum radiation, the Parfitt system radiates less energy in a rearward direction and radiates more energy through the windshield and into the passenger compartment of the vehicle.

When the whip element is removed from the Parfitt antenna, the far-field field-strength measurements are only slightly reduced. This illustrates the lossy nature of the Parfitt matching system and exemplifies the degree of radiation present from the matching ciruit enclosure. In the present invention, by contrast, the far-field field-strength drops essentially to zero when the antenna element is removed.

In comparison to the Rychlik system, the present invention provides a matched impedance, and thus a low VSWR, at the inside plates, thereby allowing transmit operation. The degradation of Rychlik's system performance when the windshield is wet is also overcome in the present invention by coupling energy through the window at a low impedance. This low impedance coupling is the very antithesis of Rychlik's teachings.

The present invention also provides many advantages over the Mobile Mark OW-900 antenna. The maximum current point on the OW-900 radiators is at the outside coupling plate, well below the roof level of the vehicle. This contributes to the OW-900's radiation pattern distortion and the high level of radiation passing through the windshield and into the passenger compartment of the vehicle. The present invention, by contrast, has the radiator's maximum current point well above the roof line, eliminating these problems. Similarly, the lack of gain in the OW-900 system is here overcome by permitting the use of radiators, such as half-wave elements and collinear arrays, that produce omnidirectional gain.

Operation

By using a two conductor transmission line operated at a low impedance to couple radio frequency energy through a windshield, the effects of stray impedances coupled to the inside and outside conducting plates of the present invention are minimized. For example, the effect of a stray resistance shunted across the two outside conducting plates 29 and 31 by the presence of water on windshield 27 is greatly reduced, as compared to other through-the-glass feed systems which display a high impedance adjacent the windshield surface.

Moisture on windshield 27 can also change the effective area of the coupling capacitor(s) formed by the inside and outside plates, in a manner roughly analogous to that deliberately implemented in the Kirkendall system. This water-induced effect, however, is a random function that renders the antenna feed point impedance unpredictable. The low impedance across both the inside and outside pair of plates of the present invention again minimizes this effect compared to the high impedance systems.

Lastly, coupling a two conductor, low impedance feed line through the glass tends to constrain the electromagnetic fields to the region between the pairs of plates, so that parasitic coupling to extraneous bodies, such as windshield wiper blades, is minimized. Thus, in the present invention a foreign body can touch enclosure 49, and can come in close proximity to mounting element 47, without detuning the system. The Parfitt system, by contrast, would be completely detuned by such a foreign body.

By coupling a matched two conductor transmission line through the windshield at a low impedance, the illustrated feed system operates with high efficiency and overcome many of the drawbacks of the prior art devices.

Although the above discussion has detailed several different systems, it should be apparent to those skilled in the art that there are many other combinations of antenna elements and matching circuits that may also be used to advantage with the concepts of the present invention. Accordingly, I claim all such modifications as come within the scope and spirit of the following claims.

We claim:

1. A through-the-glass, moisture-insensitive feed system for a mobile antenna comprising:
   - first and second inside conducting plate means adjacent an inside surface of the glass and spaced apart from one another, and first and second outside conducting plate means adjacent an outside surface of the glass opposite the corresponding first and second inside plate means, for coupling radio frequency energy through the glass;
   - coaxial feed means for coupling radio frequency energy to the inside conducting plate means, a center conductor of said feed means being connected to the first inside plate means and a shield conductor of said feed means being connected to the second inside plate means;

decoupling means for reducing the radio frequency current flow on the shield conductor of the coaxial feed means;

matching means for presenting across the inside plate means an impedance substantially equal to an impedance of the coaxial feed means, the matching means comprising a series inductor-capacitor circuit connected across the first and second outside plate means, the first outside plate means being connected to the capacitor and the second outside plate means being connected to the inductor, the matching means having an output to the antenna at a junction between the capacitor and the inductor; and antenna mounting means for isolating the antenna from the first and second outside plate means, connecting the antenna to the output of the matching means and mounting the antenna outside and spaced apart from the glass.

2. The feed system of claim 1 in which the decoupling means includes a conductor, an odd number of electrical quarter-wavelengths in length, connected at one of its ends to the second inside plate means.

3. The feed system of claim 1 in which the decoupling means comprises a doughnut-shaped ferromagnetic core through which the coaxial feed means is looped.

4. The feed system of claim 1 in which the decoupling means comprises a conductive sleeve member surrounding a section of the coaxial feed means, said sleeve member being connected at a first end to the shield conductor of the coaxial feed means and extending, insulated from said shield conductor, for a distance substantially equal to an odd number of electrical quarter-wavelengths in said sleeve, to an end of the coaxial feed means adjacent the first and second inside conducting plate means.

5. The feed system of claim 1 in which the antenna mounting means comprises a metal shell connected to one of the outside plate means and including an insulating member through which the antenna is connected to the matching means output, the metal shell and insulator thereby providing a capacitive element between said one of the outside plate means and the antenna.

6. A through-the-glass feed system for a mobile antenna comprising:

first and second inside conducting plate means, spaced apart from one another and affixed to an inside surface of the glass, and first and second outside conducting plate means, spaced apart from one another and affixed to an outside surface of the glass opposite the corresponding first and second inside plate means, for coupling radio frequency energy through the glass;

coaxial feed means coupled to the inside plate means for coupling radio frequency energy to the inside plate means;

antenna coupling means for coupling the antenna to both of the outside plate means; and matching means interposed between the coaxial feed means and the antenna for applying to the coaxial feed means from the antenna a substantially purely resistive impedance that substantially matches an impedance of the coaxial feed means.

7. The feed system of claim 6 in which the matching means is interposed between the outside plate means and the mobile antenna.

8. A windshield-mounted antenna system comprising:

antenna means for transmitting or receiving radio frequency energy;

first and second inside conducting plate means adjacent an inside surface area of the windshield and spaced apart from one another, and first and second outside conducting plate means, spaced apart from one another and adjacent an outside surface area of the windshield opposite the corresponding inside surface area, for capacitively coupling radio frequency energy through the windshield at a low impedance;

coaxial feed means for coupling radio frequency energy to or from the inside conducting plate means, an end of the coaxial feed means terminating adjacent the inside conducting plate means, a center conductor of said feed means being coupled to the first inside plate means and a shield conductor of said feed means being coupled to the second inside plate means;

matching means for causing the magnitude of the radio frequency voltage across the outside plate means to substantially match the magnitude of the radio frequency voltage across the center conductor and shield conductor of the coaxial feed means, the matching means having two inputs, each connected to a different one of said outside plate means and further having one output coupled to both of the inputs and isolated from at least one of said outside plate means by a reactance; and antenna mounting means for isolating the antenna means from at least one of the first and second outside plate means, connecting the antenna means to the output of the matching means and mounting the antenna means outside and spaced apart from the windshield.

9. The antenna system according to claim 8 in which the antenna means is unloaded and self-resonant at a desired frequency of operation and in which the matching means does not load the antenna means.

10. The antenna system of claim 8 in which the antenna means comprises a collinear array of two half-wave elements operated in phase.

11. A feed system for coupling radio frequency energy through an insulator to and from an antenna having a characteristic antenna impedance, comprising:

first and second inside conducting plate means, spaced apart from one another and affixed to an inside surface area of the insulator, and first and second outside conducting plate means, spaced apart from one another and affixed to an outside surface area of the insulator opposite the inside surface area, for coupling radio frequency energy through the insulator;

two conductor transmission line means for coupling radio frequency energy to and from the inside conducting plate means, a first conductor of said transmission line means being coupled to the first inside plate means and a second conductor of said transmission line means being coupled to the second inside plate means, the transmission line means having a predetermined characteristic impedance; and external matching means, having inputs connected to the first and second outside plate means and having an output for connection to the antenna, for presenting across the inside plate means at a frequency of interest a substantially purely resistive impedance approximately equal to said transmission line means characteristic impedance; and antenna coupled means for connecting the antenna to the output of the matching means.

12. The feed system of claim 11 in which the matching means comprises a series inductor-capacitor circuit having a first side of the capacitor connected to the first outside plate means, a first end of the inductor connected to the second outside plate means and a second side of the capacitor connected to a second end of the inductor at the matching means output.

13. The feed system of claim 11 which further includes a decoupling means for decoupling the transmission line means from the antenna.

14. The feed system of claim 11 in which the two conductor transmission line means comprises a coaxial transmission line.

15. A windshield-mounted antenna system comprising:

first and second inside conducting plate means adjacent an inside surface area of the windshield and spaced apart from one another, and first and second outside conducting plate means adjacent an outside surface area of the windshield opposite the inside surface area, the first inside and outside plate means forming a first coupling capacitor and the second inside and outside plate means forming a second coupling capacitor, for capacitively coupling radio frequency energy through the windshield;

two conductor transmission line means for coupling radio frequency energy to and from the inside conducting plate means, a first conductor of said transmission line means being coupled to the first inside plate means and a second conductor of said transmission line means being coupled to the second inside plate means, the two conductor transmission line means having a characteristic impedance; and antenna means for transmitting and receiving radio frequency energy and for coupling the radio frequency energy to and from the first and second outside conducting plate means, the antenna means including an antenna element and further including inductive means having an inductive reactance for cancelling the capacitive reactance introduced by the coupling capacitors, thereby to provide a resistive impedance across said inside conducting plate means that substantially matches the characteristic impedance of the transmission line means.

16. The antenna system of claim 15 in which the transmission line means provides, across the outside plate means, an impedance having a resistive component substantially equal to the transmission line means characteristic impedance.

17. The antenna system of claim 16 in which the characteristic impedance of the transmission line is sufficiently low to provide insensitivity to moisture on the windshield.

18. The antenna system of claim 17 in which the transmission line means comprises a coaxial cable having a characteristic impedance of about 50 ohms.

19. The antenna system of claim 17 in which the antenna means comprises two antenna elements, each of which is coupled to at least one of the outside plate means.

20. The antenna system of claim 19 in which the two antenna elements present an antenna impedance to the antenna means and the antenna means transforms the antenna impedance to a selected impedance having an inductive component.

21. A feed system for driving an antenna through an insulator comprising:

means for coupling both conductors of a two conductor transmission line from a location on one side of the insulator to an antenna on the other side; and matching means, connected to said transmission line between said location and the antenna, for presenting to said transmission line an impedance which is substantially purely resistive and which substantially matches the characteristic impedance of said transmission line at a desired frequency of interest.

22. A moisture-insensitive method of coupling radio frequency energy from a two conductor transmission line having a characteristic impedance to an antenna through an insulator, comprising the steps:

mounting first and second conducting plates adjacent an inside surface area of the insulator;

spacing the second conducting plate apart from the first conducting plate;

coupling a first conductor of the transmission line to the first conducting plate;

coupling a second conductor of the transmission line to the second conducting plate;

mounting third and fourth conducting plates adjacent an outside surface area of the insulator opposite said inside surface area;

capacitively coupling the radio frequency energy through the insulator from the first and second plates to the third and fourth plates, respectively;

providing a matching circuit having inputs connected to the third and fourth plates and having an output connected to the antenna, so as to present, across the first and second plates, a substantially purely resistive impedance which matches the characteristic impedance of the transmission line.

23. The method of claim 22 which further comprises decoupling the transmission line from the antenna.

24. The method of claim 22 in which providing the matching circuit includes providing a series inductor-capacitor circuit across the third and fourth plates and tuning said series inductor-capacitor circuit to provide, across the first and second plates, an impedance which matches the characteristic impedance of the transmission line.

25. A method of coupling an unbalanced coaxial feed line through a windshield and driving an unbalanced antenna therefrom comprising the steps:

connecting a center conductor of the feed line to an inside "hot" conducting plate mounted on an inside surface of the windshield;

connecting a shield conductor of the feed line to an inside "common" conducting plate mounted on the inside surface of the windshield and spaced apart from the inside "hot" plate;

capacitively coupling the inside "hot" and "common" conducting plates to outside "hot" and "common" conducting plates mounted on an outside surface of the windshield opposite said inside "hot" and "common" plates respectively;

connecting an "L" network of reactive components across the outside "hot" and "common" plates; and driving the unbalanced antenna from an output of the "L" network between the outside "hot" and "common" plates.

* * * * *